United States Patent
Busca et al.

[11] Patent Number: 5,847,618
[45] Date of Patent: Dec. 8, 1998

[54] ATOMIC MASER WITH CYLINDRICAL SAPPHIRE STORAGE BULB

[75] Inventors: Giovanni Busca, Neuchâtel; Laurent-Guy Bernier, Villiers; Pascal Rochat, Marin, all of Switzerland

[73] Assignee: Observatoire Cantonal de Neuchatel, Neuchatel, Switzerland

[21] Appl. No.: 718,162

[22] Filed: Sep. 19, 1996

[30]     Foreign Application Priority Data

Sep. 29, 1995  [EP]  European Pat. Off. .......... 95 115412.9

[51] Int. Cl.⁶ .................................. H03L 7/26; H01S 1/06
[52] U.S. Cl. ..................................... 331/94.1; 313/318.02
[58] Field of Search .................. 331/3, 94.1; 313/318.02

[56]            References Cited

U.S. PATENT DOCUMENTS

| | | |
|---|---|---|
| 4,449,105 | 5/1984 | Frank et al. ................................ 331/3 |
| 4,706,042 | 11/1987 | Stein ...................................... 331/94.1 |
| 5,327,105 | 7/1994 | Liberman et al. ...................... 331/94.1 |

FOREIGN PATENT DOCUMENTS 2 044 521  10/1980  United Kingdom .

OTHER PUBLICATIONS

IEEE Transactions on Instrumentation and Measurement, vol. IM–36, No. 2, Jun. 1987, New York US, pp. 588–593, XP002005029 R.F.C. Vessot et al.: "A Hydrogen Maser at Temperatures Below 1 K".

*Primary Examiner*—David Mis
*Attorney, Agent, or Firm*—Griffin, Butler Whisenhunt & Szipl

[57]            ABSTRACT

An atomic maser comprises a walled enclosure (76) defining a resonant cavity (4), and a storage bulb (8) for storing a medium capable of stimulated emission. The storage bulb is a sapphire cylinder (70) that is open at both ends and has two closure members (71,72) for closing the open ends. The closure members are made substantially of titanium and have a coating (73,74) of polyfluoroethene formed on their inner surfaces. At least one of the closure members (71,72) forms part of the walled enclosure.

12 Claims, 1 Drawing Sheet

ATOMIC MASER WITH CYLINDRICAL SAPPHIRE STORAGE BULB

FIELD OF THE INVENTION

The present invention relates to atomic frequency standards, and more particularly to atomic frequency standards comprising a resonant cavity containing a medium capable of stimulated emission. The invention is suitable for use in active hydrogen masers and it will be convenient to hereinafter disclose the invention in relation to that exemplary application. It is to be appreciated, however, that the invention is not limited to this application. In particular, the invention is applicable to all active frequency standards, in which the stimulated emissions of the atomic medium is self-sustained, as well as to all passive frequency standards, which require external excitation.

BACKGROUND OF THE INVENTION

Atomic hydrogen masers known from the prior art generally include a storage bulb which is either supported or mounted at the centre of a cylindrical resonant cavity by means of rods, so as to maximise the magnetic field concentration in the vicinity of the medium in the storage bulb. These rods extend from the walls of the resonant cavity to the storage bulb. The storage bulb and the mounting rods are made from quartz which has low electric losses and thus does not significantly spoil the quality factor of the resonant cavity.

In addition, a coating of polyfluoroethene is applied to the inner surface of the storage bulb. This coating allows many collisions of the hydrogen atoms or other medium stored in the storage bulb with the walls of this latter without significantly disturbing the oscillations of the atoms. In order to further minimise the electrical losses of the microwave cavity, the inner walls of the cavity are coated with a lining of metal, such as silver or aluminium.

Another known type of maser includes a storage bulb made of sapphire and mounted centrally within an aluminium resonant cavity. The storage bulb comprises a monocrystaline sapphire cylinder which is closed at both ends by sapphire closure members. In this type of maser, the storage bulb is made from sapphire as this material has an extremely high dielectric constant which results in even lower electric losses than it possible with quartz.

Each of the closure members consists of a plate for closing one of the two cylinder openings, each plate having a number of projections on the surface which is external to the cylinder. These projections are integral with the plate and extend laterally from the plate and away from the sapphire cylinder so as support the storage bulb in the centre and away from the walls of the cavity when the maser is assembled. The sapphire cylinder and the sapphire closure members are maintained in fixed relation, firstly, by compression applied from the walls of the resonant cavity when the maser is assembled and, secondly, by means of sapphire-sapphire bonding between contiguous parts of the cylinder and the closure members. A storage bulb of uniform composition and structure is thus obtained which, when centrally mounted in the resonant cavity, has extremely low electric losses.

However, these known masers have all a relatively large volume, which is undesirable in many situations, notably in masers intended to be included in satellites or other applications in space.

In addition, such masers suffer from the problem of mechanical instability. In particular, only a few support rods or projections between the storage bulb and the walls of the resonant cavity can be used in each maser, in order that the disturbance to the quality factor of the cavity is kept to a minimum. However, this results in a certain structural fragility which is undesirable in applications involving mechanical shocks, such as are encountered in spaceborne masers.

SUMMARY OF THE INVENTION

An object of the present invention is to provide an atomic frequency standard which overcomes or alleviates the disadvantages of the prior art.

A further object of the invention is to provide an atomic frequency standard of simple design and construction.

With this in mind, the present invention provides a walled enclosure defining a resonant cavity therein and a storage bulb for storing a medium capable of stimulated emission, the storage bulb comprising a sapphire cylinder, open at both ends, and two closure members for closing said cylinder ends, wherein the closure members are made substantially of titanium and have a coating of polyfluoroethene formed on their inner surfaces and at least one of said closure members form part of said walled enclosure.

Due to this combination of characteristics, a maser is provided which is both structural rigid and which optimises the size of the resonant cavity and the storage bulb.

The following description refers in more detail to the principles and various features of the atomic frequency standard of the present invention. In order to facilitate an understanding of the invention, reference is made in the description to the accompanying drawings where the invention is illustrated in a preferred embodiment. It is to be understood that the atomic frequency standard of the present invention is not limited to the preferred embodiment as illustrated in the drawings.

DESCRIPTION OF A PREFERRED EMBODIMENT

Figure 1:
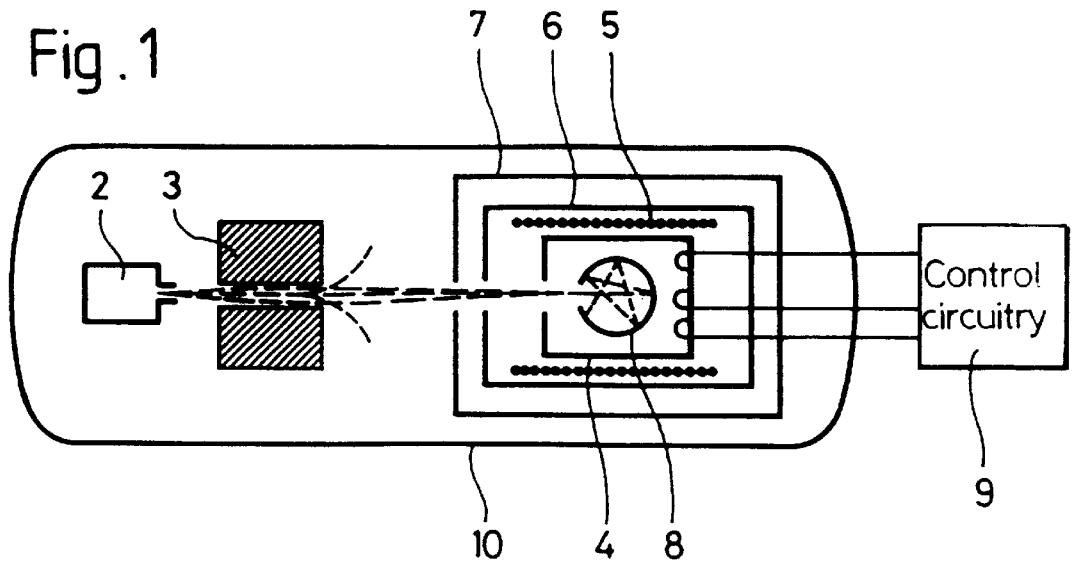
FIG. 1 is a schematic diagram showing the principles operation of an atomic frequency standard embodying the invention.

The operating principles of one example of an atomic maser according to the present invention will now be described with reference to FIG. 1. In particular, FIG. 1 shows an atomic hydrogen maser 1 comprising a source 2 of a medium capable of stimulated emission, a state selector 3, a resonant cavity 4, a coil 5, two magnetic shields 6 and 7, a storage bulb 8 and associated control circuitry 9. The elements 2 to 7 of the atomic hydrogen maser 1 are mounted in a vacuum chamber 10.

The beam source 2 is a radio-frequency gas discharge in molecular hydrogen which produces atomic hydrogen with high efficiency. The atomic hydrogen beam leaves the source 2 through one or many channels into the vacuum chamber 10. The beam of atomic hydrogen traverses a state selecting magnet 3 and enters the storage bulb 8 in the microwave cavity 4. The state selector 3 eliminates, by divergence, the hydrogen atoms situated in the lower state (F=0, $m_F$=0) and converges the hydrogen atoms situated in the upper energy state (F=1, $m_F$=0) towards the opening of the storage bulb 8. This storage bulb 8 is situated at the centre of a cylindrical microwave cavity, tuned to the frequency of the hyperfine transition of the hydrogen atoms therein.

A connection is also effected between the control circuitry 9 and the resonant cavity 4 in order that this latter may be tuned to the natural frequency of the stimulated emissions of the hydrogen atoms in the storage bulb.

Figure 2:
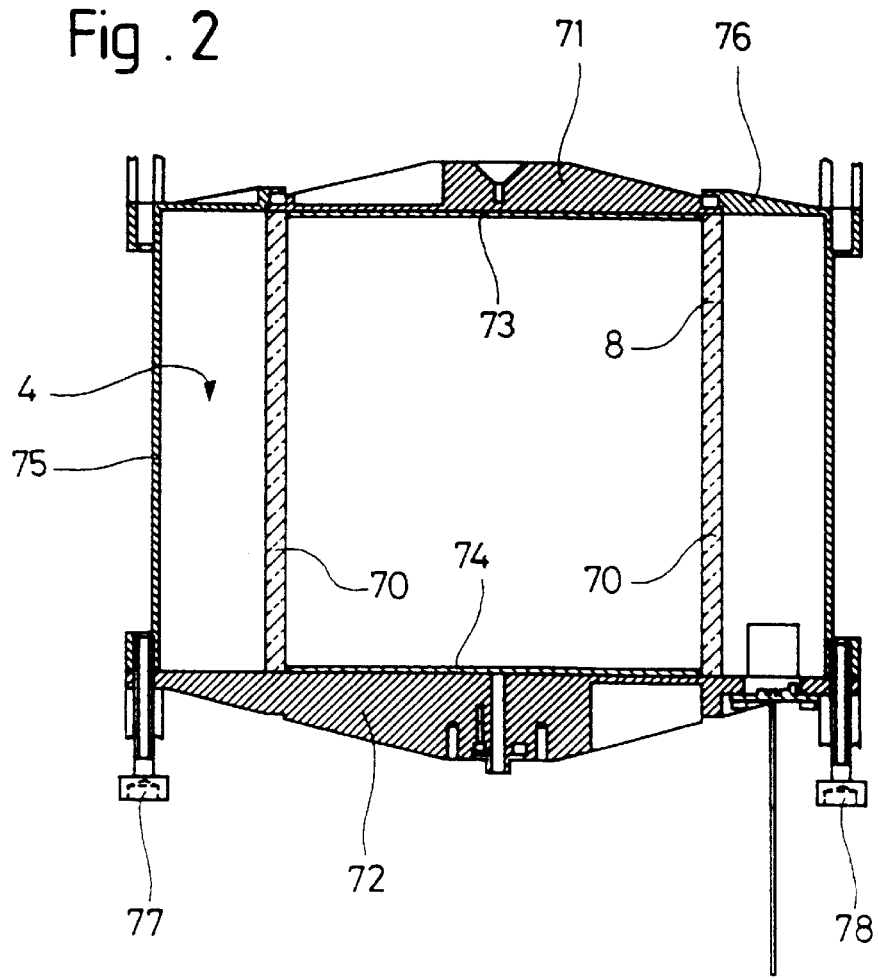
FIG. 2 shows a cross-sectional view of one embodiment of the storage bulb and microwave cavity of the atomic frequency standard of FIG. 1.

FIG. 2 shows an example of the storage bulb 4 and microwave cavity 8 suitable for use with the atomic frequency standard shown in FIG. 1.

The storage bulb 8 shown in FIG. 2 comprises a sapphire cylinder 70, made preferably from monocrystaline sapphire. The sapphire cylinder 70 has an opening at both end of its longitudinal axis. These openings are closed by two closure members, respectively referenced 71 and 72.

The closure members 71 and 72 are made at least substantially of titanium, which is a light yet extremely rigid material and is therefore well suited to applications where these qualities are important, such as in spaceborne masers.

In addition, the closure members 71 and 72 each have a coating, respectively referenced 73 and 74, of polyfluoroethene formed on their inner surfaces so as to allow many collisions of the hydrogen atoms stored in the storage bulb 8 with the walls of this latter without significantly disturbing the oscillations of the atoms. A similar coating is also formed on the inner surface of the sapphire cylinder 70 for the same reasons.

As seen from FIG. 2, the resonant cavity 4 is defined by a walled enclosure 76 which is partially formed by the two closure members 71 and 72. More particularly, the walled enclosure 76 comprises a cylindrical shell 75, which is closed at both ends by end walls, and the two closure members 71 and 72. In this embodiment, the closure members 71 constitutes part of one end wall of the walled enclosure 76 whilst the closure member 72 entirely constitutes the other end wall of the walled enclosure 76.

This structure enables a significant reduction in the size and an improvement in the structural strength of the resonant cavity when compared to the prior art, as the storage bulb is no longer centrally supported within the resonant cavity so as to be separate from the walled enclosure but now actually forms part of the walled enclosure defining the cavity.

It is known that the magnetic field generated in the resonant cavity is zero at the walls which define it and has a maximum at the centre of the cavity. The prejudice in the field of maser construction has therefore been to avoid at all costs the placement of the storage bulb near the walls which define the resonant cavity so as to avoid amplitude modulation of the magnetic field experienced by the hydrogen atoms in the storage bulb. It was believed that any such modulation would have an adverse effect on the microwave signal detected in the resonant cavity.

Furthermore, a prejudice in the field of maser construction has been to construct storage bulbs entirely from one material, such as quartz or sapphire. It was believed that the use of a homogenous material was necessary to avoid any disorientation of the hydrogen atoms in the storage bulb, and that such disorientation would cause the hydrogen atoms to lose their phase, once again creating an adverse effect on the microwave signal detected in the resonant cavity.

Surprisingly, the inventors have found that the line of the stimulated emission from the medium contained in the resonant cavity not adversely affected by the structure shown in FIG. 2 wherein the storage bulb closure members form part of the walled enclosure defining the cavity. Equally unexpected was the fact that the inventors determined that a coating of polyfluoroethene on the inner surface of the closure members acts to mask the nature of the material forming these members from the hydrogen atoms in the storage bulb, and that the sapphire cylinder itself substantially determines the dielectric characteristics of the storage bulb. Accordingly, the structural and spatial advantages described above are obtained by the structure shown in FIG. 2, without suffering a degradation in the quality of the maser signal.

Preferably, the closure members 71 and 72 are fixed to the sapphire cylinder 70 by means of one or more aluminium diffusion bonds. Such bonds have been previously developed for joining optically transparent materials to metal housings to allow the bonding of two dissimilar materials, one of which is brittle. Such bonds are formed by the thermal diffusion of aluminium into the surface layers of the two dissimilar materials. Next, the two materials are pressed together at elevated temperatures in a vacuum. Aluminium diffusion bonding of sapphire to titanium is especially suited to the present invention because of the very similar thermal expansion coefficients of the two materials.

The cylindrical shell is preferably substantially made of titanium in order that the walled enclosure 76 is composed of elements (i.e. the cylindrical shell 75 and the closure members 71 and 72) which are homogeneous and which have the same electromagnetic properties.

As seen in FIG. 2, the structural strength of the storage bulb 8 and the walled enclosure 75 is reinforced by the fact that the closure member 72 extends beyond the sapphire cylinder 70 so as to entirely constitute one of the end walls of the walled enclosure 76. Such an arrangement adds, firstly, to the simplicity of the maser by limiting the numbers of elements required to construct the resonant cavity and the storage bulb and, secondly, to the mechanical strength of the maser by limiting the number of joins which need to be made between the various elements constituting the resonant cavity and the storage bulb.

The cylindrical shell 75 may be releasably mounted to one of the closure members, as is the case of the closure member 72 in FIG. 2, which closure member extends beyond the sapphire cylinder 70. In this example, titanium bolts 77 and 78 are used to secure these two elements together.

Finally, it is to be understood that various modifications and/or additions may be made to the communication apparatus without departing from the ambit of the present invention as defined in the claims appended hereto.

For example, whilst in the resonant cavity shown in FIG. 2 both closure members 71 and 72 form at least part of the end wall of the walled enclosure 76, it will be appreciated that only one closure member need constitute part of one such end wall in order for a reduction in the dimensions of the maser to be achieved.

We claim:
1. An atomic maser comprising:
a walled enclosure defining a resonant cavity therein, and,
a storage bulb for storing a medium capable of stimulated emission, said storage bulb comprising a sapphire cylinder having open first and second ends, and first and second closure members for closing said first and second ends, respectively, characterized in that said closure members are made substantially of titanium and have a coating of polyfluoroethene formed on their inner surfaces, and in that one of said closure members comprises a first part of said walled enclosure.

2. An atomic maser according to claim 1, characterized in that said closure members are fixed to said sapphire cylinder by means of one or more aluminium diffusion bonds.

3. An atomic maser according to claim 1, characterized in that said walled enclosure is made substantially of titanium.

4. An atomic maser according to claim 1, characterized in that said walled enclosure comprises a cylindrical shell closed at first and second ends by first and second end walls, respectively, and in that said first part of said walled enclosure is a part of one of said end walls.

5. An atomic maser according to claim 4, characterized in that one of said closure members extends beyond said sapphire cylinder to constitute a further part of one of said end walls.

6. An atomic maser according to claim 5, characterized in that said cylindrical shell is releasably mounted to one of said closure members, said one closure member extending beyond said sapphire cylinder.

7. An atomic maser according to claim 2, characterized in that said walled enclosure is made substantially of titanium.

8. An atomic maser according to claim 2, characterized in that said walled enclosure comprises a cylindrical shell closed at first and second ends by first and second end walls, respectively, and in that said first part of said walled enclosure is a part of one of said end walls.

9. An atomic maser according to claim 3, characterized in that said walled enclosure comprises a cylindrical shell closed at first and second ends by first and second end walls, respectively, and in that said first part of said walled enclosure is a part of one of said end walls.

10. An atomic maser comprising:

a walled enclosure comprising a shell with first and second end walls for closing the shell to thereby form a resonant cavity, and, a storage bulb for storing a medium capable of stimulated emission, said storage bulb comprising a sapphire cylinder having open first and second ends and first and second closure members for closing said first and second ends, respectively, said closure members being made substantially of titanium and having inner surfaces with a coating of polyfluoroethene formed thereon, one of said closure members comprising a first part of one of said end walls.

11. An atomic maser as claimed in claim 10 wherein said first and second closure members comprise respective first parts of said first and second end walls.

12. An atomic maser as claimed in claim 11 wherein one of said first and second closure members extends beyond said sapphire cylinder and comprises an entire one of said first and second end walls.

* * * * *